United States Patent
Park et al.

(10) Patent No.: US 8,735,891 B2
(45) Date of Patent: May 27, 2014

(54) DISPLAY SUBSTRATE AND METHOD OF MANUFACTURING THE SAME

(75) Inventors: JeongMin Park, Seoul (KR); Jung-Soo Lee, Seoul (KR); Ji-Hyun Kim, Seoul (KR); Gwui-Hyun Park, Osan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/334,572

(22) Filed: Dec. 22, 2011

(65) Prior Publication Data

US 2013/0020591 A1 Jan. 24, 2013

(30) Foreign Application Priority Data

Jul. 22, 2011 (KR) .......................... 10-2011-0073288

(51) Int. Cl.
*H01L 21/336* (2006.01)
*H01L 29/04* (2006.01)

(52) U.S. Cl.
USPC .................. 257/59; 257/40; 257/48; 257/88; 257/E21.58; 257/E33.062; 257/E33.066; 349/39; 349/42; 349/190; 438/29; 438/34; 438/155; 438/166

(58) Field of Classification Search
USPC .......... 257/40, 48, 59, 88, E21.158, E33.062, 257/E33.066; 349/39, 42, 190; 438/29, 34, 438/155, 166
See application file for complete search history.

(56) References Cited

U.S. PATENT DOCUMENTS

| | | | | |
|---|---|---|---|---|
| 7,839,462 B2 * | 11/2010 | Lin | ................................. | 349/47 |
| 7,920,241 B2 * | 4/2011 | Tanaka et al. | ................. | 349/141 |
| 8,124,975 B2 * | 2/2012 | Noda et al. | ...................... | 257/59 |
| 2006/0251628 A1 * | 11/2006 | Attawia et al. | ............... | 424/93.7 |
| 2006/0290864 A1 | 12/2006 | Oh et al. | | |
| 2008/0017855 A1 * | 1/2008 | Kim et al. | ........................ | 257/48 |
| 2008/0169471 A1 * | 7/2008 | Shin et al. | ....................... | 257/59 |
| 2008/0179596 A1 * | 7/2008 | Cho et al. | ......................... | 257/59 |
| 2009/0191653 A1 * | 7/2009 | Lee | .................................. | 438/29 |
| 2009/0251628 A1 * | 10/2009 | Lin | .................................. | 349/39 |
| 2010/0301341 A1 * | 12/2010 | Huh et al. | ........................ | 257/59 |
| 2011/0014736 A1 * | 1/2011 | Kim et al. | ........................ | 438/34 |
| 2011/0254827 A1 * | 10/2011 | Tamura et al. | ................. | 345/212 |
| 2011/0294244 A1 * | 12/2011 | Hattori et al. | .................... | 438/34 |

FOREIGN PATENT DOCUMENTS

| KR | 10-2002-0057235 A | 7/2002 |
|---|---|---|
| KR | 10-2008-0075717 A | 8/2008 |

* cited by examiner

*Primary Examiner* — Dao H Nguyen
(74) *Attorney, Agent, or Firm* — Cantor Colburn LLP

(57) ABSTRACT

A display substrate includes first, second, and third insulating layers in a display area thereof. The first and third insulating layers are in not only the display area but also a pad area adjacent to the display area and including a pad therein. Thus, defects of the display panel may be reduced.

26 Claims, 14 Drawing Sheets

DISPLAY SUBSTRATE AND METHOD OF MANUFACTURING THE SAME

This application claims priority to Korean Patent Application No. 10-2011-0073288 filed on Jul. 22, 2011, and all the benefits accruing therefrom under 35 U.S.C. §119, the contents of which are herein incorporated by reference in its entirety.

BACKGROUND OF THE INVENTION

1. Field of the Invention

The invention relates to a display substrate and a method of manufacturing the same. More particularly, the invention relates to a display substrate capable of preventing contact defects and a method of manufacturing the display substrate.

2. Description of the Related Art

A liquid crystal display is a thin and flat display device including a liquid crystal layer. The liquid crystal display is classified into an in-plane switching ("IPS") mode liquid crystal display, a vertical alignment ("VA") mode liquid crystal display, and a plane-to-line switching ("PLS") mode liquid crystal display according to the driving method for the liquid crystal layer.

The PLS mode liquid crystal display drives the liquid crystal layer using a horizontal electric field and a vertical electric field. In the PLS mode liquid crystal display, liquid crystal molecules are rotated substantially parallel to the substrates of the PLS mode liquid crystal display due to a strong fringe electric field.

The PLS mode liquid crystal display includes a display substrate on which plural signal lines, and pads respectively connected to the signal lines, are disposed. In addition, the display substrate includes an insulating layer to cover the signal lines and the pads. However, the insulating layer is separated from the pads in the PLS mode liquid crystal display.

BRIEF SUMMARY OF THE INVENTION

Exemplary embodiments of the invention provide a display substrate capable of preventing contact defects.

Exemplary embodiments of the invention provide a method of manufacturing the display substrate without using a half-tone mask.

According to the exemplary embodiments, a display substrate includes a base substrate including a display area in which at least one pixel area is disposed, and a pad area disposed adjacent to at least one side of the display area, at least one signal line disposed on the base substrate, at least one common line disposed on the base substrate and insulated from the signal line, a thin film transistor disposed in the pixel area and connected to the signal line, a first insulating layer disposed on the base substrate and including a first thru-hole through which a portion of a drain electrode of the thin film transistor is exposed and a second thru-hole through which a portion of the common line is exposed, a second insulating layer disposed on the first insulating layer to correspond to the display area and including a third thru-hole through which the portion of the drain electrode is exposed and a fourth thru-hole through which the portion of the common line is exposed, a common electrode disposed on the second insulating layer in the pixel area, a third insulating layer disposed on the first insulating layer and the second insulating layer and including a fifth thru-hole through which the portion of the drain electrode is exposed, a sixth thru-hole through which the portion of the common line is exposed, and a seventh thru-hole through which a portion of the common electrode is exposed, a pixel electrode disposed on the third insulating layer in the pixel area and connected to the exposed portion of the drain electrode, and a connection electrode connected between the exposed portion of the common line and the exposed portion of the common electrode. The first, second, and third insulating layers are sequentially deposited on the display area, and the first and third insulating layers are sequentially deposited on the pad area.

The third thru-hole exposes a first contact area of the first insulating layer and includes the first thru-hole provided thereinside in a plan view. The fourth thru-hole exposes a second contact area of the first insulating layer and includes the second thru-hole provided thereinside in the plan view.

The signal line includes at least one gate line disposed in the display area and extended in a first direction, at least one data line disposed in the display area, extended in a second direction crossing the first direction, and insulated from the gate line, a gate pad disposed in the pad area and connected to the gate line, and a data pad disposed in the pad area and connected to the data line.

The first insulating layer further includes a first pad thru-hole through which a portion of the gate pad is exposed, and a second pad thru-hole through which a portion of the data pad is exposed. The third insulating layer further includes a third pad thru-hole corresponding to the first pad thru-hole and a fourth pad thru-hole corresponding to the second pad thru-hole.

A gate pad electrode is disposed in the first pad thru-hole and the third pad thru-hole to be connected to the gate pad, and a data pad electrode is disposed in the second pad thru-hole and the fourth pad thru-hole to be connected to the data pad.

According to the exemplary embodiments, a method of manufacturing a display substrate is provided as follows. At least one signal line, at least one common line insulated from the signal line, and a thin film transistor connected to the signal line are formed on a base substrate including a display area in which at least one pixel area is disposed, and a pad area disposed adjacent to at least one side of the display area. When a first insulating layer and a second insulating layer are formed on the base substrate, a first exposure hole is formed to expose a first contact area of the first insulating layer corresponding to at least a portion of a drain electrode of the thin film transistor and a second exposure hole is formed to expose a second contact area of the first insulating layer corresponding to at least a portion of the common line. Then, a common electrode is formed on the second insulating layer corresponding to the pixel area and a third insulating layer is formed on the first insulating layer and the second insulating layer. When third, fourth, and fifth exposure holes are formed to expose the portion of the drain electrode, the portion of the common line, and a portion of the common electrode, a pixel electrode is disposed on the third insulating layer corresponding to the pixel area and connected to the exposed portion of the drain electrode. A connection electrode is connected between the exposed portion of the common line and the exposed portion of the common electrode.

The method further includes exposing the first insulating layer corresponding to the pad area and forming a sixth exposure hole to expose the gate pad and a seventh exposure hole to expose the data pad.

The method further includes forming a gate pad electrode in the third exposure hole to be connected to the gate pad and forming a data pad electrode in the fourth exposure hole to be connected to the data pad.

According to the above, the display substrate includes the first, second, and third insulating layers in the display area, and the first and third insulating layers in the pad area. The second insulating layer is not in the pad area. The pad thru-holes are formed through the first and third insulating layers in the pad area. The gate pad electrode and the data pad electrode are respectively connected to the gate pad and the data pad through the pad thru-holes, thereby reducing defects in the pad area.

In addition, the display substrate may be manufactured without using a half-tone mask during the process of patterning the first, second, and third insulating layers.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION OF THE INVENTION

Figure 1:
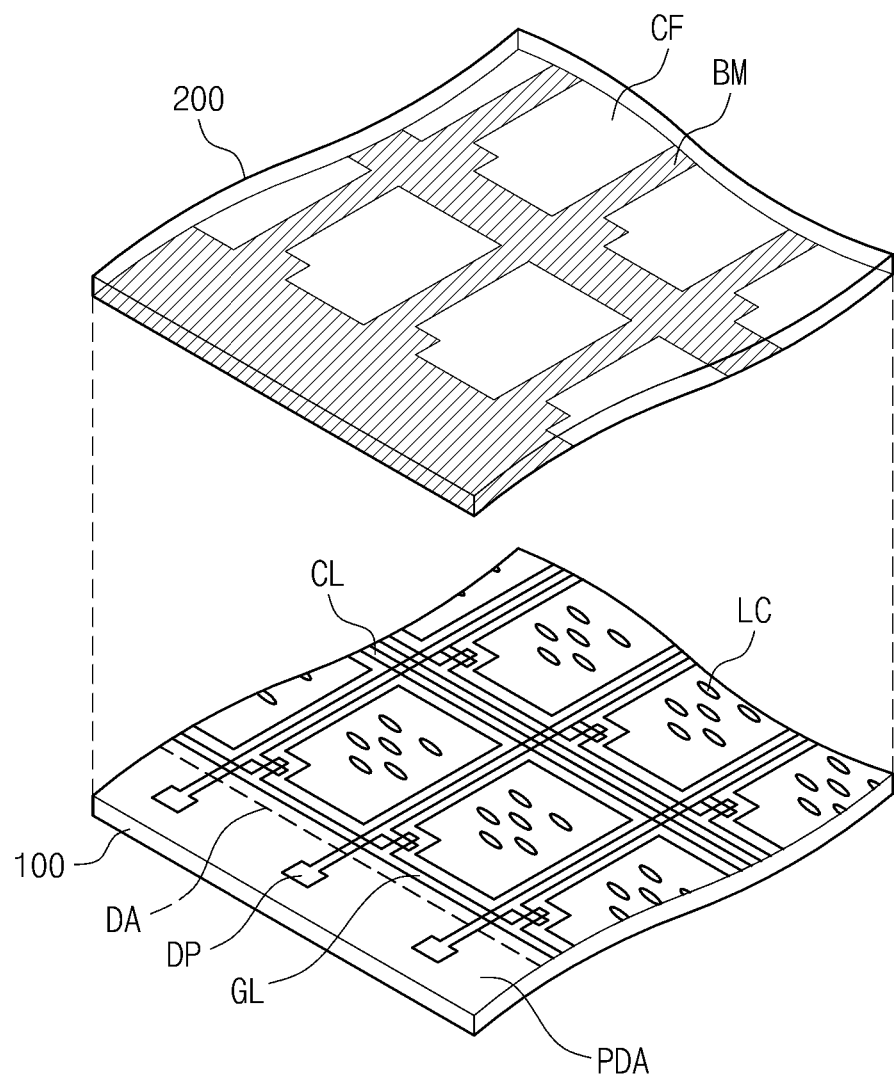
FIG. 1 is a perspective view showing an exemplary embodiment of a display substrate according to the invention.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

Figure 2:
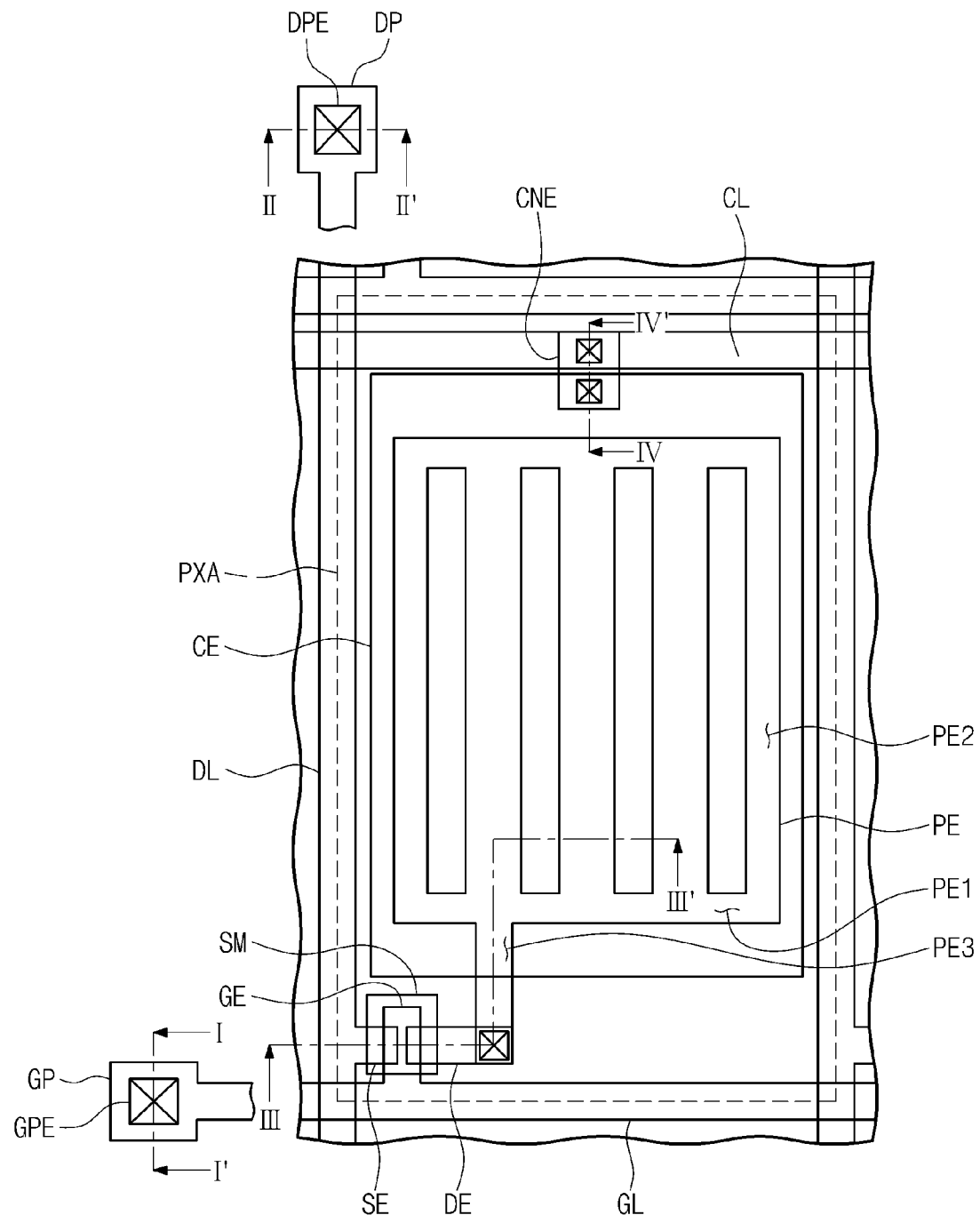
FIG. 2 is a plan view showing a portion of the display substrate of FIG. 1.
Figure 3:
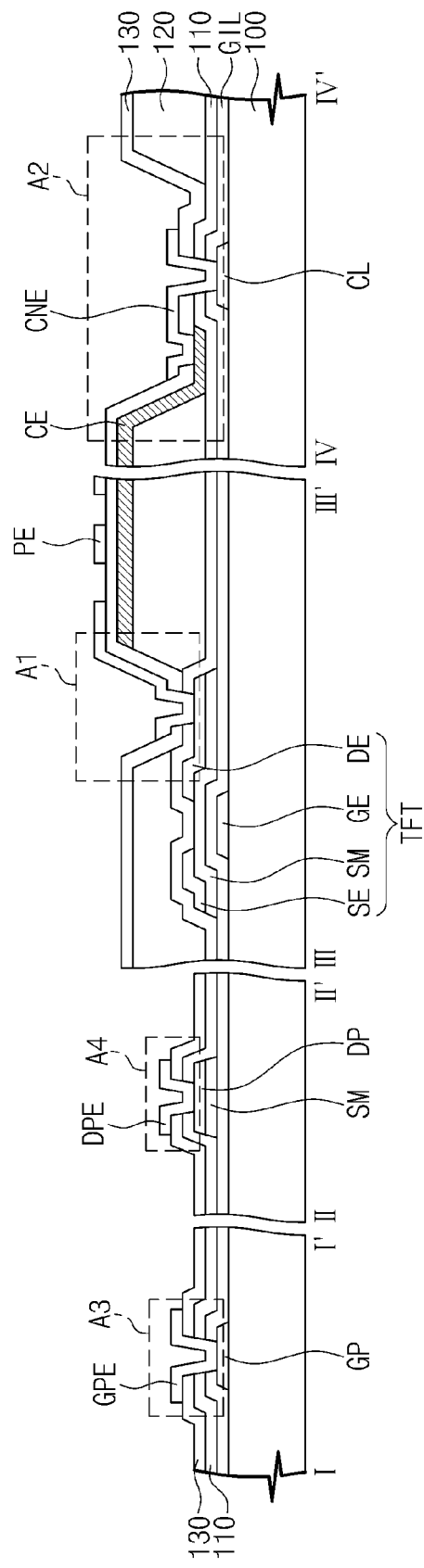
FIG. 3 is a cross-sectional view taken along lines I-I', II-II', III-III', and IV-IV' of FIG. 2.

FIG. 1 is a perspective view showing an exemplary embodiment of a display substrate according to the invention, FIG. 2 is a plan view showing a portion of the display substrate of FIG. 1, FIG. 3 is a cross-sectional view taken along lines I-I', II-IF, III-III', and IV-IV' of FIG. 2, and FIGS. 4A to 4D are enlarged views showing portions A1, A2, A3, and A4 of FIG. 3.

The exemplary embodiment of the display substrate according to the invention includes a plurality of pixels to display an image. The display substrate may be used for various display panels, such as a liquid crystal display, an organic light emitting display panel, an electrophoretic display panel, an electro-wetting display panel, etc.

As shown in FIG. 1, the display substrate may form the liquid crystal display together with an opposite substrate 200, and a liquid crystal layer LC disposed between the display substrate and the opposite substrate 200. The opposite substrate 200 may include color filters CF respectively corresponding to pixels PX, and a black matrix BM surrounding and/or overlapping the pixels PX to block light passing through and/or between the pixels PX. According to alternative embodiments, the color filters CF may be disposed on the display substrate.

Referring to FIGS. 1 to 3 and 4A to 4D, the display substrate includes a base substrate 100 including a display area DA, and a pad area PDA disposed adjacent to the display area DA. The display area DA displays the image and includes at least one pixel area PXA. The pixel area PXA includes a pixel electrode PE, and a thin film transistor TFT connected to the pixel electrode PE.

In addition, at least one signal line is disposed on the base substrate 100. The signal line includes at least one gate line GL longitudinally extended in a first direction and at least one data line DL longitudinally extended in a second direction crossing the first direction. The signal line further includes a gate pad GP connected to one end of the gate line GL and a data pad DP connected to one end of the data line DL. The data pad DP and the gate pad GP are disposed in the pad area PDA in which the image is not displayed.

Further, at least one common line CL insulated from the gate line GL and the data line DL, and longitudinally extended in the first direction is disposed on the base substrate 100. The gate line GL, the data line DL, and the common line CL are disposed in the display area DA.

Although the display area DA includes a plurality of pixel areas PXA, the pixel areas PXA may have the same structure and function. Accordingly, FIGS. 2 and 3 show one pixel area PXA, the gate line GL adjacent to the one pixel area PXA, the common line CL adjacent to the one pixel area PXA, and the data line DL adjacent to the one pixel area PXA. In addition, the gate pad GP and the data pad DP corresponding to the one pixel area PXA have been shown with the one pixel area PXA.

Hereinafter, the structure of the display area DA and the structure of the pad area PDA will be described in detail.

A gate insulating layer GIL is disposed on the base substrate 100. The gate insulating layer GIL is disposed in both of the display area DA and the pad area PDA. The gate insulating layer GIL covers (e.g., overlaps) the gate line GL, the common line CL, and the gate pad GP, which are disposed on the base substrate 100, and includes a first insulating material, such as silicon nitride, silicon oxide, etc. The data line DL and the data pad DP are disposed on the gate insulating layer GIL.

The pixel area PXA includes the thin film transistor TFT, a common electrode CE, and the pixel electrode PE connected to the thin film transistor TFT.

The thin film transistor TFT is connected to the gate line GL and includes a gate electrode GE protruded from the gate line GL when viewed in a plan view. The gate electrode GE may include indium tin oxide ("ITO"), indium zinc oxide ("IZO"), or indium tin zinc oxide ("ITZO"). In addition, the gate electrode GE may include a double-layer structure of a first electrode layer including the above-mentioned material, and a second electrode layer including the following material. The second electrode layer may include a metal material, such as copper (Cu), molybdenum (Mo), aluminum (Al), tungsten (W), chromium (Cr), titanium (Ti), or an alloy thereof.

In addition, the thin film transistor TFT includes a semiconductor layer SM, a source electrode SE, and a drain electrode DE. The semiconductor layer SM is disposed on the gate electrode GE while interposing the gate insulating layer GIL therebetween. The semiconductor layer SM includes an active layer disposed on the gate insulating layer GIL and an ohmic contact layer disposed on the active layer. The active layer is disposed on an area including the source electrode SE and the drain electrode DE and an area corresponding to between the source electrode SE and the drain electrode DE. The ohmic contact layer is disposed between the active layer and the source electrode SE and between the active layer and the drain electrode DE.

The source electrode SE is branched from the data line DL and partially overlapped with the gate electrode GE in a plan view. The drain electrode DE is spaced apart from the source electrode SE and partially overlapped with the gate electrode GE in the plan view. The source electrode SE and the drain electrode DE may include a metal material, such as copper (Cu), molybdenum (Mo), aluminum (Al), tungsten (W), chromium (Cr), titanium (Ti), or an alloy thereof. In the illustrated exemplary embodiment, the source electrode SE and the drain electrode DE are overlapped with a portion of the semiconductor layer SM in an area except for an area between the source electrode SE and the drain electrode DE.

The semiconductor layer SM may be disposed between the data line DL and the gate insulating layer GIL. In addition, the semiconductor layer SM may be disposed between the data pad DP and the gate insulating layer GIL.

A first insulating layer 110 is disposed on the base substrate 100. The first insulating layer 110 is disposed on the gate insulating layer GIL to cover the display area DA and the pad area PDA. The first insulating layer 110 includes a first thru-hole TH1 to expose a portion of the drain electrode DE and a second thru-hole TH2 to expose a portion of the common line CL.

To this end, the second thru-hole TH2 penetrates completely through a thickness of the gate insulating layer GIL disposed between the first insulating layer 110 and the common line CL. In the illustrated exemplary embodiment, the portion of the common line CL exposed through the second thru-hole TH2 may be the protruded portion from the common line CL when viewed in a plan view. The first insulating layer 110 may include silicon nitride or silicon oxide.

In addition, the first insulating layer 110 includes a first pad thru-hole PTH1 to expose a portion of the gate pad GP and a second pad thru-hole PTH2 to expose a portion of the data pad DP.

To this end, the first pad thru-hole PTH1 penetrates completely through a thickness of the gate insulating layer GIL disposed between the first insulating layer 110 and the gate pad GP, thereby exposing the portion of the gate pad GP.

A second insulating layer 120 is disposed on the first insulating layer 110 corresponding to the display area DA. The second insulating layer 120 may include an organic material such as acrylic resin. The second insulating layer 120 includes a third thru-hole TH3 corresponding to the first thru-hole TH1 and a fourth thru-hole TH4 corresponding to the second thru-hole TH2.

In this case, the third thru-hole TH3 has a cross-sectional area larger than that of the first thru-hole TH1 and the fourth thru-hole TH4 has a cross-sectional area larger than that of the second thru-hole TH2. In other words, the third thru-hole TH3 has a diameter larger than a diameter of the first thru-hole TH1 and the fourth thru-hole TH4 has a diameter larger than a diameter of the second thru-hole TH2.

Accordingly, the third thru-hole TH3 exposes a first contact area CNA1 of the first insulating layer 110. When viewed in a plan view, the first thru-hole TH1 is positioned inside the first contact area CNA1, and thus the third thru-hole TH3 exposes the portion of the drain electrode DE together with the first thru-hole TH1.

In addition, the fourth thru-hole TH4 exposes a second contact area CNA2 of the second insulating layer 120. In a plan view, the second thru-hole TH2 is positioned inside the second contact area CNA2, and thus the fourth thru-hole TH4 exposes the portion of the common line CL together with the second thru-hole TH2.

The display substrate includes the common electrode CE disposed on the second insulating layer 120 corresponding to the pixel area PXA. The common electrode CE is applied with a common voltage provided through the common line CL. The common electrode CE includes a transparent conductive material substantially same as the first electrode layer of the gate electrode GE.

The portion of the common electrode CE may be disposed on an inner wall of second insulating layer 120 in the fourth thru-hole TH4. The portion of the common electrode CE on the inner wall of the fourth thru-hole TH4 is connected to a connection electrode CNE described below.

The display substrate includes a third insulating layer 130 disposed on the first insulating layer 110 and the second insulating layer 120. The third insulating layer 130 is disposed directly on the second insulating layer 120 in the display area DA and disposed directly on the first insulating layer 110 in the pad area PDA. Particularly, the third insulating layer 130 may include the same material as that of the first insulating layer 110.

The third insulating layer 130 includes a fifth thru-hole TH5 corresponding to the third thru-hole TH3, a sixth thru-hole TH6 corresponding to the fourth thru-hole TH4, and a seventh thru-hole TH7 that exposes a portion of the common electrode CE. That is, the fifth thru-hole TH5 exposes the portion of the drain electrode DE together with the first thru-hole TH1 and the third thru-hole TH3, and the sixth thru-hole TH6 exposes the portion of the common line CL together with the second thru-hole TH2 and the fourth thru-hole TH4.

The third insulating layer 130 may be extended to an inner wall of the third thru-hole TH3 and the first contact area CNA1. Thus, the fifth thru-hole TH5 may be extended from the first thru-hole TH1 through the third insulating layer 130 above the first contact area CNA1.

The third insulating layer 130 may be extended to the inner wall of the fourth thru-hole TH4 and the second contact area CNA2. Thus, the sixth thru-hole TH6 may be extended from the second thru-hole TH2 through the third insulating layer 130 in the second contact area CNA2.

The seventh thru-hole TH7 penetrates completely through a thickness of the third insulating layer 130 disposed on the inner wall of the fourth thru-hole TH4 or penetrates through the third insulating layer 130 in the second contact area CNA2.

The third insulating layer 130 is disposed directly on the first insulating layer 110 in the pad area PDA. The third insulating layer 130 disposed in the pad area PDA includes a third pad thru-hole PTH3 corresponding to the first pad thru-hole PTH1 and a fourth pad thru-hole PTH4 corresponding to the second pad thru-hole PTH2.

The display substrate includes the pixel electrode PE disposed on the third insulating layer 130 in the pixel area PXA. The pixel electrode PE faces the common electrode CE while interposing the third insulating layer 130 therebetween. The pixel electrode PE may include a transparent conductive material, such as ITO, IZO or ITZO.

Figure 4A:
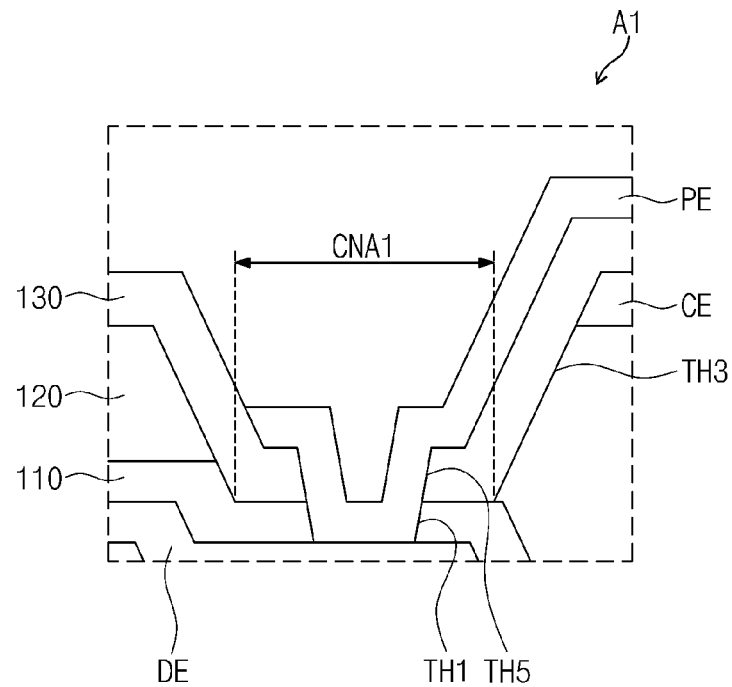
FIGS. 4A to 4D are enlarged views showing portions A1, A2, A3, and A4 of FIG. 3.
Figure 4B:
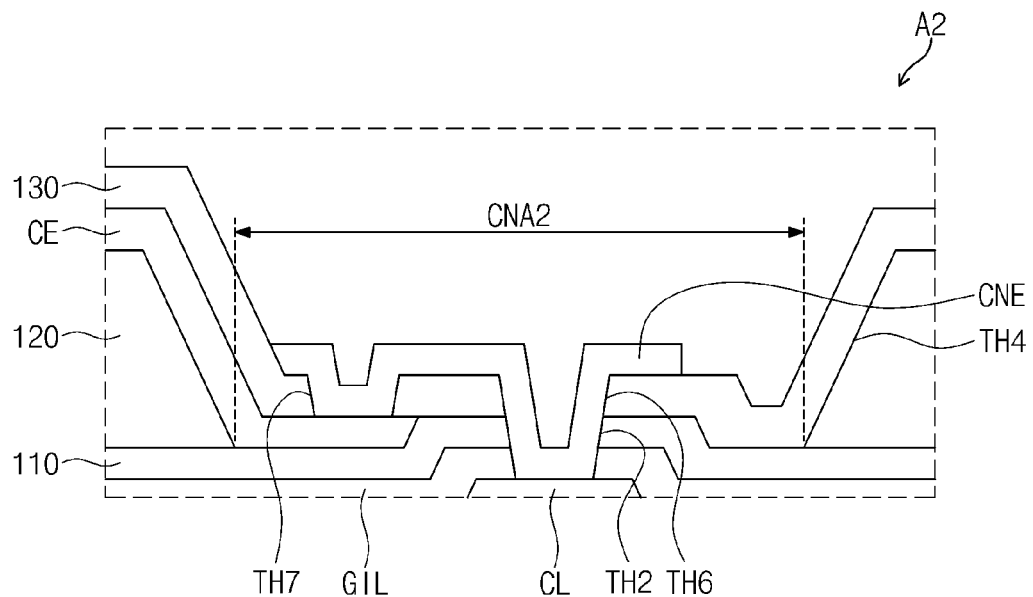

The pixel electrode PE is connected to the exposed portion of the drain electrode DE. As shown in FIG. 4A, in the case that the fifth thru-hole TH5 is extended from (e.g., aligned with) the first thru-hole TH1, the pixel electrode PE is connected to the exposed portion of the drain electrode DE through the first thru-hole TH1 and the fifth thru-hole TH5. The pixel electrode PE includes at least one trunk portion PE1, a plurality of branch portions PE2 protruded from the trunk portion PE1, and a connection portion PE3 connected between the trunk portion PE1 and the branch portions PE2 when viewed in the plan view. The connection portion PE3 may be disposed in the first thru-hole TH1 and the fifth thru-hole TH5.

The branch portions PE2 are spaced apart from each other at regular intervals. The branch portions PE2 are longitudinally extended in a predetermined direction and substantially parallel to each other. In the illustrated exemplary embodiment, the trunk portion PE1 has a closed rectangular loop shape and the branch portions PE2 are spaced apart from each other in the trunk portion PE1, but the invention is not be limited thereto or thereby. That is, the branch portions PE2 may be protruded from the trunk portion PE1 to a predetermined direction or to both directions substantially vertical to the extended direction of the trunk portion PE1, or the trunk portion PE1 and the branch portions PE2 may be bent several times.

The connection electrode CNE is disposed on the third insulating layer 130 in the pixel area PXA to connect the exposed portion of the common electrode CE to the exposed portion of the common line CL. A first end of the connection electrode CNE is physically and/or electrically connected to the common electrode CE through the seventh thru-hole TH7 and a second end opposite to the first end of the connection electrode CNE is connected to the common line CL through the second thru-hole TH2 and the sixth thru-hole TH6. The connection electrode CNE may include the same material as the pixel electrode PE.

A gate pad electrode GPE and a data pad electrode DPE are disposed on the third insulating layer 130 in the pad area PDA. The gate pad electrode GPE and the data pad electrode DPE serve as contact portions for connecting external wires used to apply signals to the pixel electrode PE. To this end, each of the gate pad electrode GPE and the data pad electrode DPE may be connected to a flexible circuit board.

The gate pad electrode GPE is connected to the gate pad GP through the first pad thru-hole PTH1 and the third pad thru-hole PTH3. In addition, the data pad electrode DPE is connected to the data pad DP through the second pad thru-hole PTH2 and the fourth pad thru-hole PTH4. The gate pad electrode GPE and the data pad electrode DPE may include the same material as the pixel electrode PE.

FIGS. 5 to 13 are cross-sectional views showing an exemplary embodiment of a method of manufacturing a display panel according to the invention. FIGS. 5 to 13 show the portions corresponding to the portions shown in FIG. 3.

Figure 5:
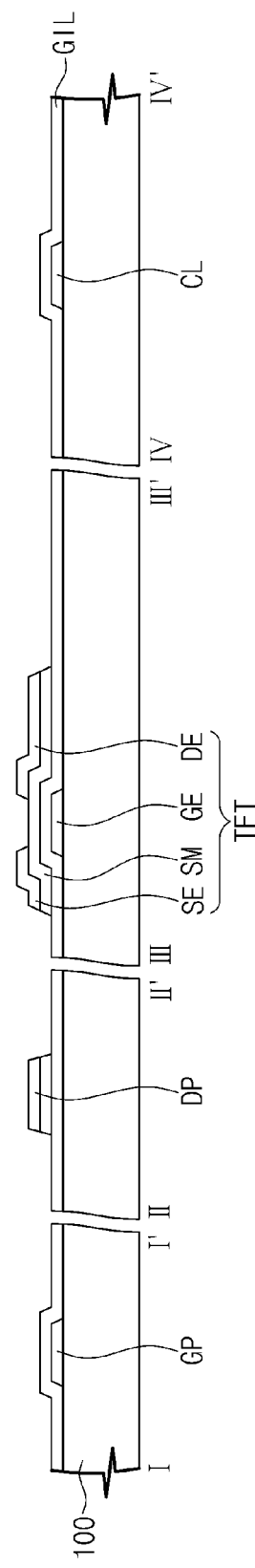
FIGS. 5 to 13 are cross-sectional views showing an exemplary embodiment of a method of manufacturing a display substrate according to the invention.

Referring to FIG. 5, at least one signal line, at least one common line CL insulated from the signal line, and the thin film transistor TFT connected to the signal line are formed on the base substrate 100 including the display area DA and the pad area PA as shown in FIG. 1.

The signal line includes at least one gate line GL longitudinally extended in the first direction, and at least one data line DL longitudinally extended in the second direction crossing the first direction and insulated from the gate line GL. The signal line includes the gate pad GP connected to the end of the gate line GL and the data pad DP connected to the end of the data line DL.

In addition, the base substrate 100 includes the thin film transistor TFT disposed in the pixel area PXA. The thin film transistor TFT includes the gate electrode GE connected to the gate line GL, the source electrode SE connected to the data line DL, and the drain electrode DE spaced apart from the source electrode SE.

The gate line GL and the common line CL are formed on the base substrate 100. The gate pad GP is formed together with the gate electrode GE. The gate line GL and the common line CL are formed by forming a conductive layer using a sputtering process and patterning the conductive layer using a photolithography process. Then, the gate insulating layer GIL is formed by using a plasma-enhanced chemical vapor deposition ("PECVD"). After sequentially depositing a semiconductor layer and a conductive layer, the semiconductor layer and the conductive layer are patterned to form the data line DL, the source electrode SE connected to the data line DL, and the drain electrode DE spaced apart from the source electrode SE. In this case, the data pad DP is formed together with those elements, e.g., such as the data line DL, the drain electrode DE, and the source electrode SE.

Figure 6:
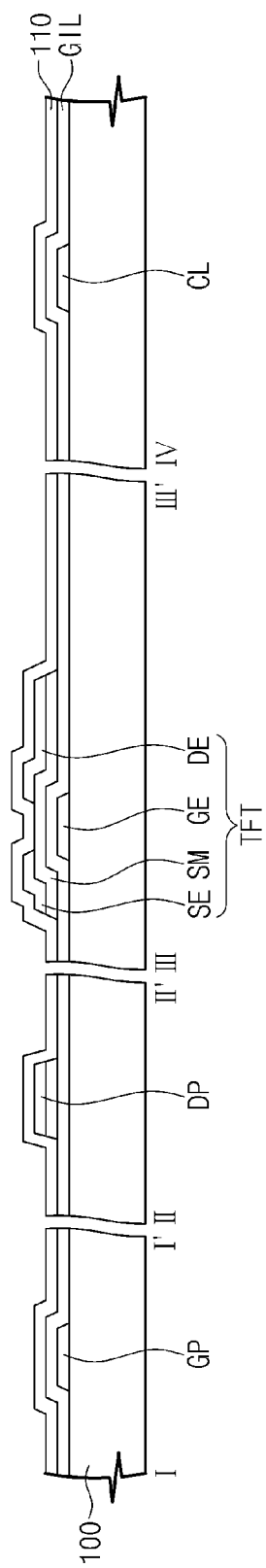

As shown in FIG. 6, the first insulating layer 110 is formed on the base substrate 100. The first insulating layer 110 is formed in the display area DA and the pad area PDA. In detail, the first insulating layer 110 is formed on the gate insulating layer GIL to cover the thin film transistor TFT and the data pad DP. The first insulating layer 110 may include silicon nitride (SiNx) using a PECVD.

Figure 7:
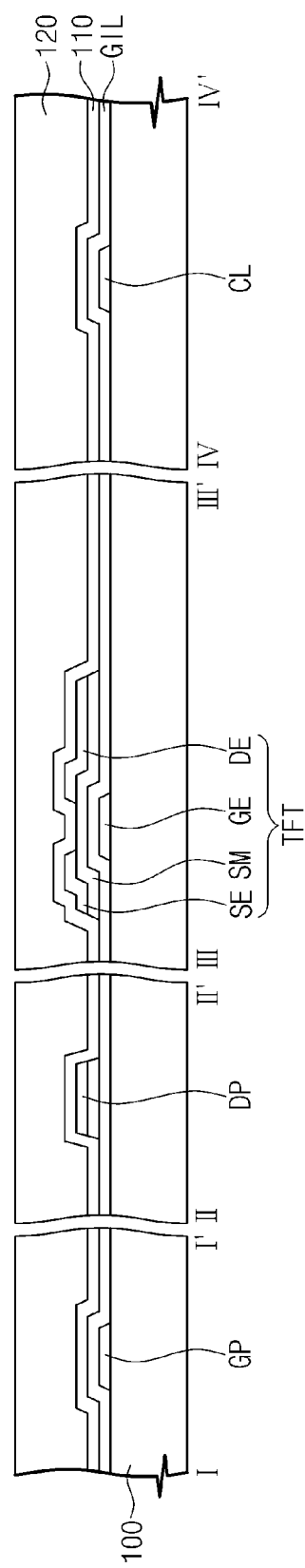

Referring to FIG. 7, the second insulating layer 120 is formed on the first insulating layer 110. The second insulating layer 120 may be formed of an acrylic resin by using various methods, such as a deposition method, a coating method, a spray method, a printing method, etc. Different from FIG. 7, the second insulating layer 120 may be formed only in the display area DA.

Figure 8:
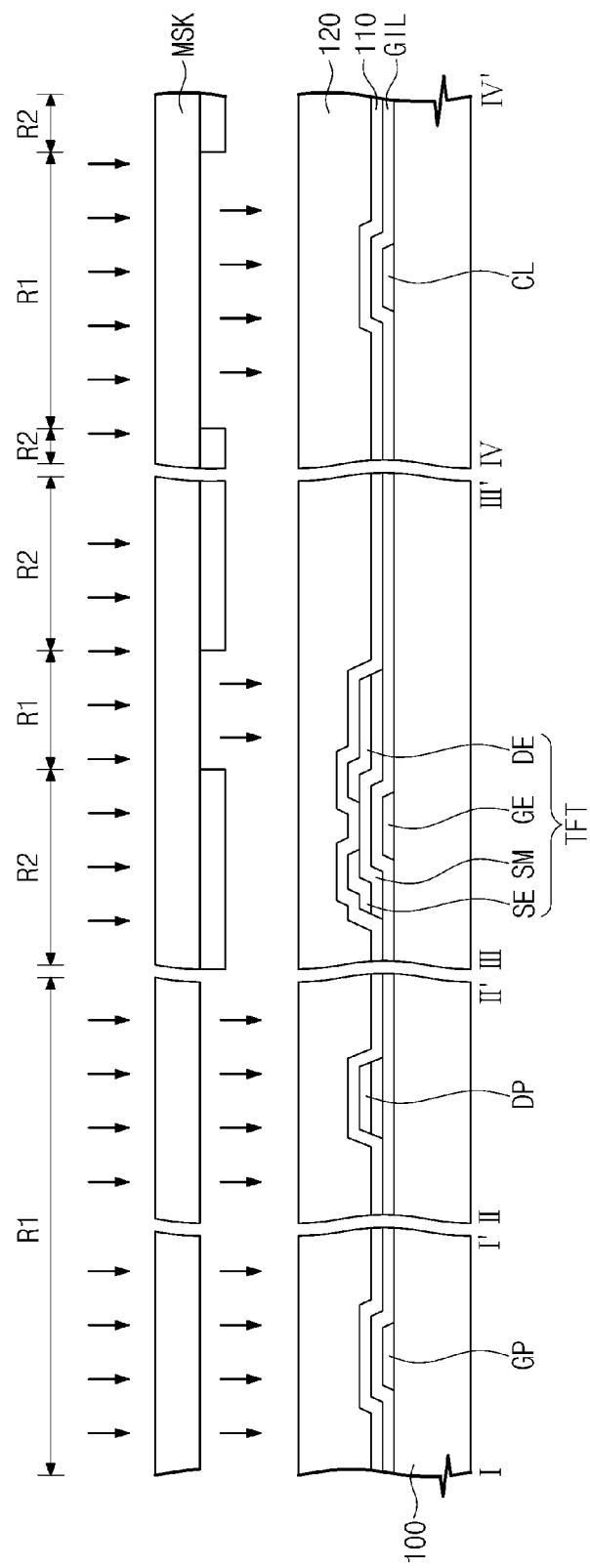
Figure 9:
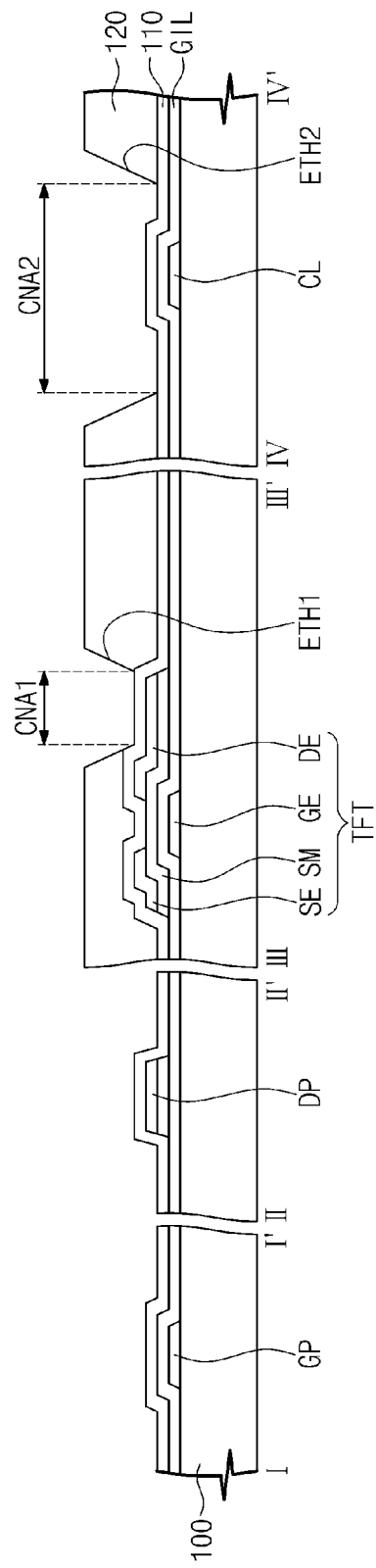

As shown in FIGS. 8 and 9, the second insulating layer 120 is patterned through an exposure and development process. Through the exposure and development process, a first exposure hole ETH1 is formed to expose the first contact area CNA1 of the first insulating layer 110, which corresponds to the portion of the drain electrode DE of the thin film transistor TFT, as shown in FIG. 9. In addition, a second exposure hole ETH2 is formed to expose the second contact area CNA2 of the first insulating layer 110, which corresponds to the portion of the common line CL, while the first exposure hole ETH1 is formed. The first exposure hole ETH1 corresponds to the third thru-hole TH3 shown in FIG. 4A and the second exposure hole ETH2 corresponds to the fourth thru-hole TH4 shown in FIG. 4B.

When the second insulating layer 120 corresponding to the pad area PDA is removed, the first insulating layer 110 on the gate pad GP and the data pad DP are exposed. The second insulating layer 120 corresponding to the pad area PDA is removed while the exposure and development process is performed to form the first and second exposure holes ETH1 and ETH2.

As shown in FIG. 8, a mask MSK is used for the exposure and development process. The mask MSK includes a first region R1 blocking the light and a second region R2 transmitting the light. The first region R1 is disposed to correspond to the area from which the second insulating layer 120 is removed. For instance, the first region R1 is disposed corresponding to the pad area PDA, the first exposure hole ETH1, and the second exposure hole ETH2. When the second insulating layer 120 is developed after being light-exposed, the second insulating layer 120 corresponding to the first region R1 is removed and the second insulating layer 120 corresponding to the second region R2 remains as shown in FIG. 9.

In the illustrated exemplary embodiment, the second insulating layer 120 is formed using a positive-type resist material of which an exposed portion thereof is removed, but the invention is not be limited thereto or thereby. That is, according to another embodiment, the second insulating layer 120 may be formed using a negative-type resist material of which an exposed portion thereof remains.

Figure 10:
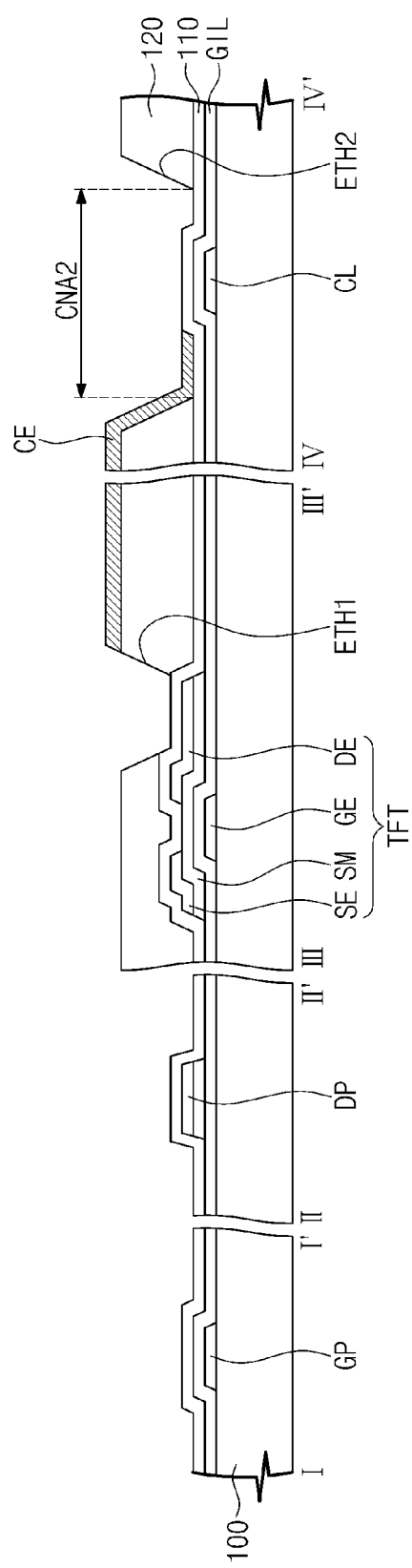

Then, as shown in FIG. 10, the common electrode CE is formed on the second insulating layer 120 to correspond to the pixel area PXA. The common electrode CE may be formed by a photolithography process.

In more detail, a conductive layer and a photoresist layer are sequentially formed on the second insulating layer 120 and the photoresist layer is exposed and developed to form a photoresist layer pattern. Then, the conductive layer is patterned using the photoresist layer pattern as a mask. The patterned conductive layer serves as the common electrode CE.

Figure 11:
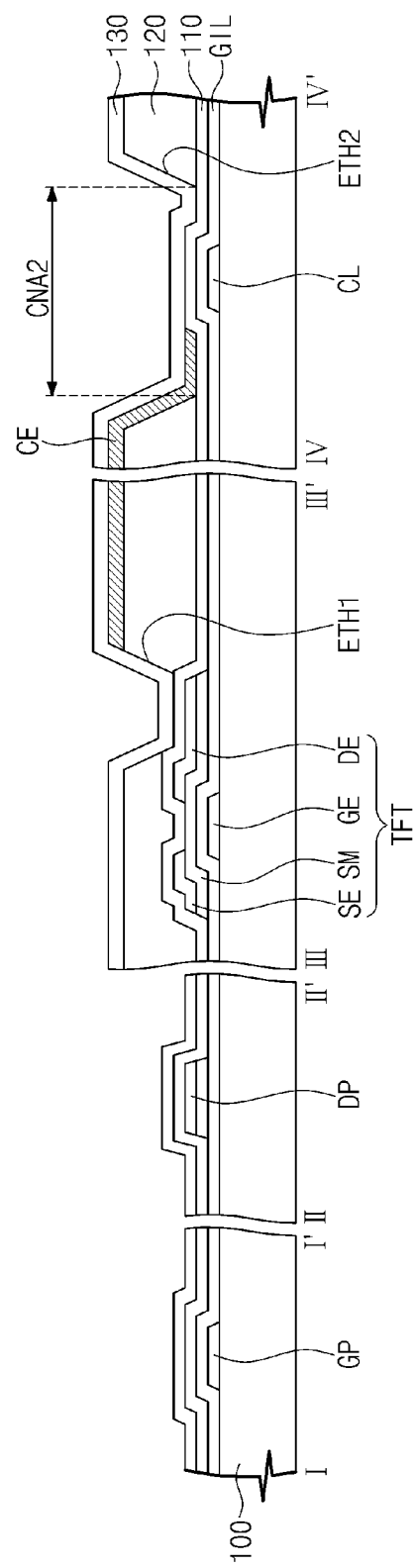

Referring to FIG. 11, the third insulating layer 130 is formed on the display area PDA and the pad area PDA. That is, the third insulating layer 130 is formed directly on the first insulating layer 110 and the second insulating layer 120. The third insulating layer 130 covers the common electrode CE disposed on the second insulating layer 120 in the pixel area PXA. The third insulating layer 130 may be formed by the PECVD.

The third insulating layer 130 may be formed on the inner wall of the first exposure hole ETH1 and on the first contact area CNA1 of the first insulating layer 110. In addition, the third insulating layer 130 may be formed on the inner wall of the second exposure hole ETH2 and on the second contact area CNA2 of the first insulating layer 110.

Figure 12:
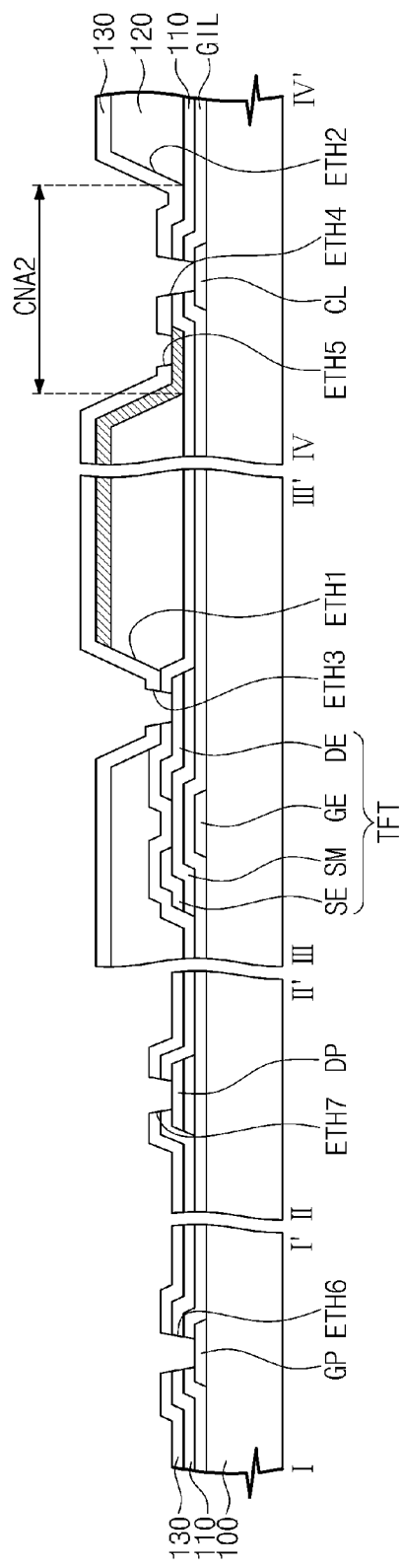

Then, as shown in FIG. 12, the first insulating layer 110 and the third insulating layer 130 are patterned to form the third exposure hole ETH3 through which at least the portion of the drain electrode DE is exposed, the fourth exposure hole ETH4 through which the portion of the common line CL is exposed, and the fifth exposure hole ETH5 through which at least the portion of the common electrode CE is exposed. The first insulating layer 110 and the third insulating layer 130 may be patterned by the exposure and development process using the mask MSK.

The third exposure hole ETH3 is formed through both the third insulating layer 130 and the first insulating layer 110 to expose the portion of the drain electrode DE. The third exposure hole ETH3 passes through the first contact area CNA1 of the first insulating layer 110. The third exposure hole ETH3 corresponds to the first thru-hole TH1 and the fifth thru-hole TH5 shown in FIG. 4A.

In addition, the fourth exposure hole ETH4 is formed through both the third insulating layer 130 and the first insulating layer 110, thereby exposing the portion of the common line CL. The fourth exposure hole ETH4 passes through the second contact area CNA2 of the first insulating layer 110. The fourth exposure hole ETH4 corresponds to the second thru-hole TH2 and the sixth thru-hole TH6 shown in FIG. 4B. In the case that the gate insulating layer GIL is disposed between the common line CL and the first insulating layer 110, the fourth exposure hole ETH4 passes through the gate insulating layer GIL.

The fifth exposure hole ETH5 is formed through the third insulating layer 130 to expose the portion of the common electrode CE. The fifth exposure hole ETH5 corresponds to the seventh thru-hole TH7 shown in FIG. 4B.

A sixth exposure hole ETH6 exposing the gate pad GP and a seventh exposure hole ETH7 exposing the data pad DP are formed. The sixth exposure hole ETH6 and the seventh exposure hole ETH7 may be substantially simultaneously formed with the third, fourth, and fifth exposure holes ETH3, ETH4, and ETH5.

Figure 4C:
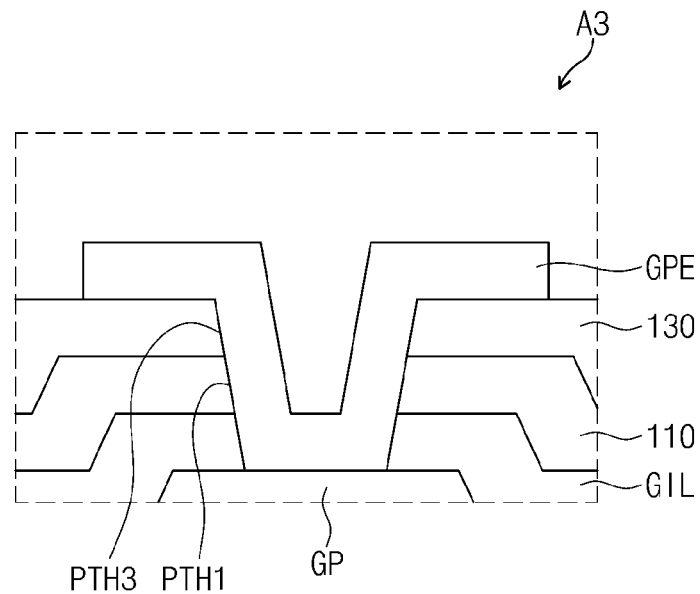
Figure 4D:
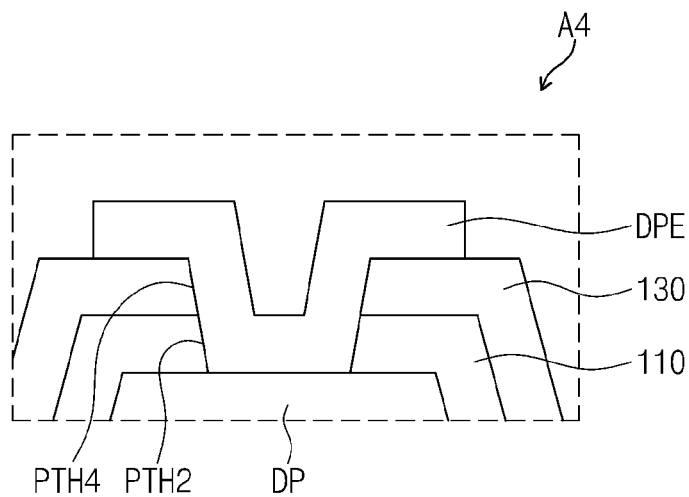

The sixth exposure hole ETH6 corresponds to the first pad thru-hole PTH1 and the third pad thru-hole PTH3 shown in FIG. 4C. In addition, the seventh exposure hole ETH7 corresponds to the second pad thru-hole PTH2 and the fourth pad thru-hole PTH4 shown in FIG. 4D.

Figure 13:
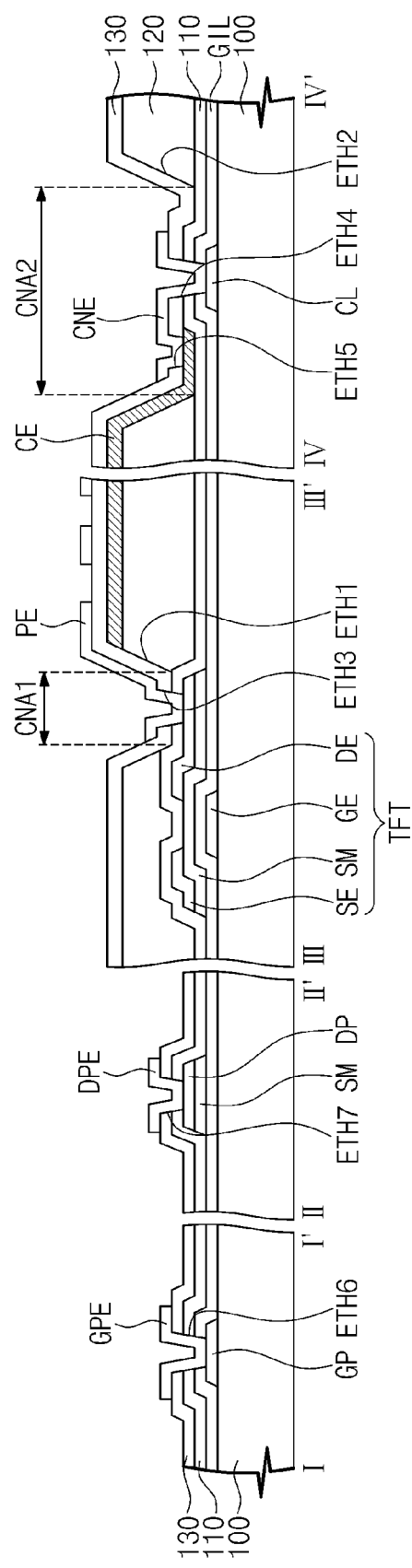

Then, as shown in FIG. 13, the pixel electrode PE is formed to be connected to the exposed portion of the drain electrode DE. In addition, the connection electrode CNE is formed to be connected to the exposed portion of the common line CL.

The pixel electrode PE is disposed on the third insulating layer 130 in the pixel area PXA and connected to the drain electrode DE through the third exposure hole ETH3. In addition, the connection electrode CNE is disposed on the third insulating layer 130, the fourth exposure hole ETH4, and fifth exposure hole ETH5 to be connected between the exposed portion of the common line CL and the exposed portion of the common electrode CE.

The pixel electrode PE and the connection electrode CNE may be formed by a photolithography process. The pixel electrode PE and the connection electrode CNE may be substantially simultaneously formed by one and the same process, e.g., the photolithography process.

In more detail, a conductive layer and a photoresist layer are sequentially formed on the third insulating layer 130. Then, the photoresist layer is patterned by the exposure and development process to form the photoresist layer pattern. The conductive layer is patterned using the photoresist layer pattern as the mask, thereby forming the pixel electrode PE and the connection electrode CNE.

In addition, the gate pad electrode GPE is formed to be connected to the gate pad GP through the sixth exposure hole ETH6, and the data pad electrode DPE is formed to be connected to the data pad DP through the seventh exposure hole ETH7.

The gate pad electrode GPE and the data pad electrode DPE may be formed by a photolithography process. The gate pad electrode GPE and the data pad electrode DPE may be substantially simultaneously formed with the pixel electrode PE and the connection electrode CNE through the photolithography process used to form the pixel electrode PE and the connection electrode CNE.

In more detail, the conductive layer and the photoresist layer are sequentially formed on the pad area PDA when the conductive layer and the photoresist layer are sequentially formed on the third insulating layer 130 during the photolithography process used to form the pixel electrode PE and the connection electrode CNE. Then, when the exposure and development process and the patterning process are performed, the gate pad electrode GPE and the data pad electrode DPE may be substantially simultaneously formed together with the pixel electrode PE and the connection electrode CNE.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display substrate comprising:
    a base substrate comprising: a display area including a pixel area, and a pad area adjacent to a side of the display area;
    a signal line disposed on the base substrate;
    a thin film transistor connected to the signal line, and including a drain electrode;
    a first insulating layer disposed on the thin film transistor, and a first thru-hole defined in the first insulating layer and corresponding to a portion of the drain electrode;
    a second insulating layer disposed on the first insulating layer, and a second thru-hole defined in the second insulating layer and corresponding to the first thru-hole;
    a common electrode disposed on the second insulating layer in the pixel area;
    a third insulating layer disposed on the second insulating layer, and a third thru-hole defined in the third insulating layer, extending directly from the first thru-hole and corresponding to the second thru-hole; and
    a pixel electrode disposed on the third insulating layer in the pixel area and connected to the portion of the drain electrode, wherein a cross-sectional area of the third thru-hole is different from a cross-sectional area of the second thru-hole.

2. The display substrate of claim 1, wherein, the cross-sectional area of the second thru-hole is larger than the cross-sectional area of the third thru-hole.

3. The display substrate of claim 1, wherein the first insulating layer has a first contact area corresponding to the first thru-hole provided thereinside in a plan view, and the third insulating layer is extended on an inner wall of the second thru-hole and on a portion of the first insulating layer in the first contact area.

4. The display substrate of claim 1, further comprising a common line disposed on the base substrate and insulated from the signal line.

5. The display substrate of claim 4, further comprising:
    a fourth thru-hole which is defined in the first insulating layer further and corresponds to a portion of the common line,
    a fifth hole which is defined in the second insulating layer, and corresponding to the fourth thru-hole,
    a sixth thru-hole and a seventh thru-hole which are defined in the third insulating layer further,
    wherein
    the sixth thru-hole corresponds to the fifth thru-hole and extends directly from the fourth thru-hole; and
    the seventh thru-hole corresponds to a portion of the common electrode.

6. The display substrate of claim 5, further comprising a connection electrode which is connected between the portion of the common line and the portion of the common electrode, and transfers a common voltage from the common line to the common electrode.

7. The display substrate of claim 6, wherein a cross-sectional area of the fifth thru-hole is larger than a cross-sectional area of the fourth thru-hole.

8. The display substrate of claim 7, wherein the fifth thru-hole exposes a second contact area of the first insulating layer including the fourth thru-hole provided thereinside in a plan view, the third insulating layer is extended on an inner wall of the fifth thru-hole and on the second contact area of the first insulating layer.

9. The display substrate of claim 1, wherein
    the first insulating layer is disposed in the display area and the pad area,
    the second insulating layer is disposed in the display area and is absent in the pad area,
    the third insulating layer is disposed in the display area and the pad area, and
    a portion of the third insulating layer is contacted with a portion of the first insulating layer in the pad area.

10. The display substrate of claim 1, wherein the signal line comprises:
    a gate line in the display area and extended in a first direction;
    a data line in the display area, extended in a second direction crossing the first direction, and insulated from the gate line;
    a gate pad in the pad area and connected to the gate line; and
    a data pad in the pad area and connected to the data line.

11. The display substrate of claim 10, further comprising
    a first pad thru-hole which is defined in the first insulating layer and corresponds to the gate pad, and
    a second pad thru-hole which is defined in the first insulating layer and located to correspond to a portion of the data pad.

12. The display substrate of claim 11, further comprising
    a third pad thru-hole which is defined in the third insulating layer further, corresponding to the first pad thru-hole and extended directly from the first pad thru-hole, and
    a fourth pad thru-hole which is defined in the third insulating layer further, corresponding to the second pad thru-hole and extended directly from the second pad thru-hole.

13. The display substrate of claim 12, further comprising:
    a gate pad electrode in the first pad thru-hole and the third pad thru-hole, and connected to the gate pad; and
    a data pad electrode in the second pad thru-hole and the fourth pad thru-hole, and connected to the data pad.

14. The display substrate of claim 1, wherein the second insulating layer comprises an organic material.

15. The display substrate of claim 1, wherein the pixel electrode comprises:
   a trunk portion,
   a plurality of branch portions protruded from the trunk portion and spaced apart from each other in a plan view, and
   a connection portion connected between the trunk portion and the drain electrode.

16. A method of manufacturing a display substrate, comprising:
   providing a signal line, a common line insulated from the signal line, and a thin film transistor connected to the signal line, on a base substrate comprising a display area including a pixel area, and a pad area adjacent to a side of the display area;
   providing a first insulating layer in the display area and the pad area, and a second insulating layer on the first insulating layer;
   defining a first exposure hole in the second insulating layer which exposes a first contact area of the first insulating layer and overlaps a portion of a drain electrode of the thin film transistor;
   providing a common electrode on the second insulating layer and in the pixel area;
   providing a third insulating layer in the display area and the pad area, on the second insulating layer;
   defining a second exposure hole in the first and third insulating layers and exposing the portion of the drain electrode,
   wherein
   the second exposure hole has a cross-sectional area different from a cross-sectional area of the first exposure hole, and
   the second exposure hole in the third insulating layer extends directly from the second exposure hole in the first insulating layer; and
   providing a pixel electrode on the third insulating layer and in the pixel area, and connected to the exposed portion of the drain electrode.

17. The method of claim 16, further comprising:
   defining a third exposure hole which exposes a second contact area of the first insulating layer and overlaps a portion of the common line;
   defining a fourth exposure hole which exposes the portion of the common line, and a fifth exposure hole which expose a portion of the common electrode; and
   providing a connection electrode which is connected between the exposed portion of the common line and the exposed portion of the common electrode.

18. The method of claim 17, wherein
   the third insulating layer is extended on an inner wall of the first exposure hole and on the first contact area of the first insulating layer, and
   the third insulating layer is extended on an inner wall of the third exposure hole and on the second contact area of the first insulating layer.

19. The method of claim 18, wherein the fourth exposure hole and the fifth exposure hole penetrate through a portion of the third insulating layer in the second contact area.

20. The method of claim 16, wherein the signal line comprises:
   a gate line in the display area and extended in a first direction;
   a data line in the display area, extended in a second direction crossing the first direction, and insulated from the gate line;
   a gate pad in the pad area and connected to the gate line; and
   a data pad in the pad area and connected to the data line.

21. The method of claim 20, further comprising:
   exposing the first insulating layer in the pad area; and
   defining a sixth exposure hole which exposes the gate pad, and a seventh exposure hole which exposes the data pad.

22. The method of claim 21, wherein
   the exposing the first insulating layer is performed together with the defining the first exposure hole and the second exposure hole, in a single process, and
   the defining the sixth exposure hole and the seventh exposure hole is performed together with the defining the third exposure hole, the fourth exposure hole and the fifth exposure hole.

23. The method of claim 22, further comprising:
   providing a gate pad electrode in the sixth exposure hole to be connected to the gate pad; and
   providing a data pad electrode in the seventh exposure hole to be connected to the data pad.

24. The method of claim 23, wherein the providing the gate pad electrode and the data pad electrode is performed together with the providing the pixel electrode and the connection electrode.

25. The method of claim 16, wherein, the cross-sectional area of the first exposure hole is larger than the cross-sectional area of the second exposure hole.

26. The method of claim 16, wherein
   the second insulating layer is disposed in the display area and absent in the pad area, and
   a portion of the third insulating layer is contacted with a portion of the first insulating layer in the pad area.

* * * * *